(12) United States Patent
Lee et al.

(10) Patent No.: US 9,830,960 B2
(45) Date of Patent: Nov. 28, 2017

(54) DATA OUTPUT CIRCUIT AND MEMORY DEVICE INCLUDING THE SAME

(71) Applicant: Samsung Electronics Co., Ltd., Suwon-si (KR)

(72) Inventors: Chang-kyo Lee, Seoul (KR);
Won-young Lee, Seongnam-si (KR);
Bo-bae Shin, Suwon-si (KR);
Jung-hwan Choi, Hwaseong-si (KR);
Yong-cheol Bae, Yongin-si (KR);
Seok-hun Hyun, Seongnam-si (KR);
Min-su Ahn, Suwon-si (KR)

(73) Assignee: SAMSUNG ELECTRONICS CO., LTD., Samsung-ro, Yeongtung-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/294,890

(22) Filed: Oct. 17, 2016

(65) Prior Publication Data

US 2017/0140799 A1    May 18, 2017

(30) Foreign Application Priority Data

Nov. 16, 2015 (KR) .......... 10-2015-0160456

(51) Int. Cl.
| | |
|---|---|
| *G11C 7/10* | (2006.01) |
| *G11C 7/22* | (2006.01) |
| *G11C 11/4076* | (2006.01) |
| *G11C 11/4093* | (2006.01) |

(52) U.S. Cl.
CPC .......... *G11C 7/1057* (2013.01); *G11C 7/1066* (2013.01); *G11C 7/1072* (2013.01); *G11C 7/222* (2013.01); *G11C 11/4076* (2013.01); *G11C 11/4093* (2013.01)

(58) Field of Classification Search
USPC ..................................... 365/189.02
See application file for complete search history.

(56) References Cited

U.S. PATENT DOCUMENTS

| | | |
|---|---|---|
| 6,008,549 A | 12/1999 | Cooper et al. |
| 6,031,413 A | 2/2000 | Mizoguchi |
| 6,188,212 B1 | 2/2001 | Larson et al. |
| 7,298,567 B2 | 11/2007 | Poss |
| 7,594,127 B2 | 9/2009 | Sutardja |
| 7,893,672 B2 | 2/2011 | Scoones et al. |
| 8,212,400 B2 | 7/2012 | Wu et al. |
| 2005/0281094 A1* | 12/2005 | Seo ............ G11C 11/4074 365/189.09 |
| 2009/0039711 A1 | 2/2009 | Williams |

(Continued)

*Primary Examiner* — Hoai V Ho
*Assistant Examiner* — Minh Dinh
(74) *Attorney, Agent, or Firm* — Muir Patent Law, PLLC

(57) ABSTRACT

A memory device may include a data output circuit configured to multiplex a plurality of data signals read from a memory cell array, wherein the data output circuit includes a clock boosting circuit configured to receive a plurality of internal clock signals generated based on a first power voltage, and to generate a plurality of boosted clock signals by boosting the plurality of internal clock signals based on a second power voltage having a voltage level greater than that of the first power voltage, and a data output driver configured to multiplex and output the plurality of data signals synchronized with the boosted clock signals.

19 Claims, 17 Drawing Sheets

(56) References Cited

U.S. PATENT DOCUMENTS

| | | | |
|---|---|---|---|
| 2010/0220039 A1* | 9/2010 | Park | H02M 3/1588 345/76 |
| 2013/0271103 A1 | 10/2013 | Gerber et al. | |
| 2015/0036448 A1* | 2/2015 | Ahn | G11C 11/4076 365/230.02 |
| 2016/0300083 A1* | 10/2016 | Ren | G06K 7/0095 |

* cited by examiner

DATA OUTPUT CIRCUIT AND MEMORY DEVICE INCLUDING THE SAME

CROSS-REFERENCE TO RELATED APPLICATION

This application claims priority under 35 U.S.C. §119 to Korean Patent Application No. 10-2015-0160456, filed on Nov. 16, 2015, in the Korean Intellectual Property Office, the disclosure of which is incorporated herein in its entirety by reference.

BACKGROUND

Embodiments of the present disclosure relate to a data output circuit and a memory device including the same, and more particularly, to a data output circuit for multiplexing a plurality of pieces of data and outputting an output data signal and a memory device including the data output circuit.

A memory device may include an output driver for outputting an internal signal to outside. An output driver typically includes a p-channel metal oxide semiconductor (PMOS) transistor and an n-channel metal oxide semiconductor (NMOS) transistor, which are connected between a power line and a ground line. Generally, synchronous dynamic random access memory (hereinafter, referred to as SDRAM) may operate by using a single data rate (SDR) method wherein data is synchronized with a rising edge of a system clock, and thus, a piece of data is input/output in a period of a clock. However, as a frequency of a system clock increases, there is typically a demand for an increase in a speed of data input/output. Accordingly, a double data rate (DDR) method has been developed wherein two pieces of data are input/output in a period of a clock by respectively inputting/outputting a piece of data with respect to a rising edge and a falling edge of a system clock. High-speed data transmission may be performed by using the DDR method even if an internal operation frequency is not increased. Additionally, recently, a low-power DDR (LPDDR) method has been employed. The LPDDR method may enable high-speed data transmission with low power consumption.

At present, according to a structure used in the LPDDR method, a plurality of data signals, which are transmitted at a frequency less than a clock frequency, are multiplexed, and thus, output to an output pad via ends of several output drivers. Multiplexed data may be transmitted to the output pad at a frequency identical to the clock frequency. However, since a data output unit using this structure in the LPDDR method includes a multiplexer implemented as a plurality of transistors for performing a multiplexing operation, it may be difficult to accurately transceive an output data signal at high speed due to a parasitic effect of the plurality of transistors and an increase in an equivalent resistance of the plurality of transistors.

SUMMARY

According to the present disclosure, an output data signal, generated by multiplexing a plurality of pieces of data, may be accurately transceived at high speed and a design area of a data output circuit in a memory device may be reduced.

According to an aspect of the invention, there is provided a memory device including a data output circuit configured to multiplex a plurality of data signals read from a memory cell array, wherein the data output circuit includes: a clock boosting circuit configured to receive a plurality of internal clock signals generated based on a first power voltage, and to generate a plurality of boosted clock signals by boosting the plurality of internal clock signals based on a second power voltage having a voltage level greater than that of the first power voltage; and a data output driver configured to multiplex and output the plurality of data signals synchronized with the boosted clock signals.

According to another aspect of the invention, there is provided a data output circuit for a memory device, configured to multiplex a plurality of data signals read from a memory cell array, the data output circuit including: a first clock boosting buffer configured to receive a first internal clock signal generated based on a first power voltage, and to generate a first boosted clock signal based on a second power voltage having a voltage level greater than that of the first power voltage; a second clock boosting buffer configured to receive a second internal clock signal generated based on the first power voltage, and to generate a second boosted clock signal by using the second power voltage; a first output driver configured to synchronize a first data signal of the plurality of data signals with the first boosted clock signal and output the first data signal to an output pad; and a second output driver configured to synchronize a second data signal of the plurality of data signals with the second boosted clock signal and output the second data signal to the output pad.

According to still another aspect of the invention, there is provided a memory device including a memory cell array including a plurality of memory cells, an internal clock buffer configured to receive an external clock signal and to output a first internal clock signal having a logic high level of the first power voltage, a first clock buffer configured to receive the first internal clock signal and to output a first output clock signal having a logic high level of a second power voltage greater than the first power voltage, a first output driver configured to receive a first data input signal from the memory cell, and to output a first data output signal having a logic high level of the first power voltage, and a first switching transistor configured to transfer the first data output signal to a first output pad in response to the first output clock signal.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
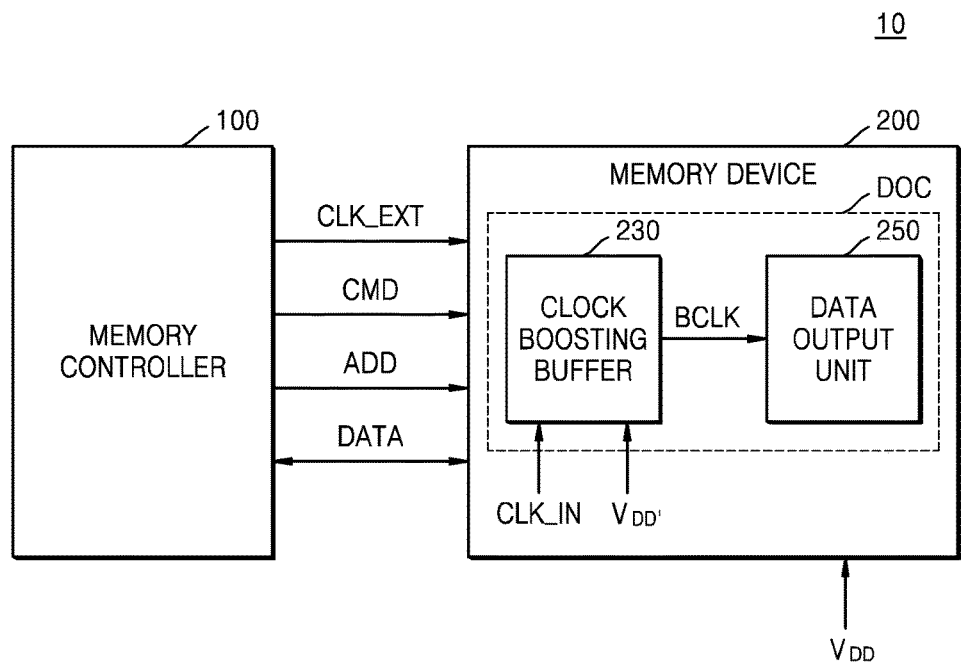
FIG. 1 is a block diagram of a memory system according to example embodiments.

Exemplary embodiments will now be described more fully with reference to the accompanying drawings. The exemplary embodiments may, however, be embodied in many different forms and should not be construed as being limited to the embodiments set forth herein. As the exemplary embodiments allows for various changes and numerous embodiments, particular embodiments will be illustrated in the drawings and described in detail in the written description. Like reference numerals in the drawings denote like elements, and thus their description will be omitted. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram of a memory system according to example embodiments. As shown in FIG. 1, the memory system 10 may include a memory controller 100 and a memory device 200. The memory controller 100 may control a memory operation such as a read or write operation by providing various control signals to the memory device 200. For example, the memory controller 100 provides a command CMD and an address ADD to the memory device 200, and thus, accesses data DATA of a memory cell array of the memory device 200. The command CMD may include a command related to various memory operations such as data write or read operation. Additionally, if the memory controller 100 provides a clock signal CLK_EXT to the memory device 200, the memory device 200 may operate in synchronization with the clock signal CLK_EXT, and thus, provide the data signal DATA to the memory controller 100. Hereinafter, the clock signal CLK_EXT received by the memory device 200 from the memory controller 100 is referred to as an external clock signal.

The memory controller 100 may access the memory device 200 according to a request from a host (not shown). For example, the memory controller 100 may receive a request related to a type of an access, and an address for designating an area of the memory device 200 to be accessed. The memory controller 100 may process a request from the host and a host address, and provide a command CMD and an address ADD to the memory device 200 based on the processing of the request and the host address.

The memory system 10 may communicate with a host by using an interface protocol such as peripheral component interconnect-express (PCI-E), advanced technology attachment (ATA), Serial ATA (SATA), parallel ATA (PATA), or serial attached SCSI (SAS). Additionally, interface protocols between the memory system 10 and a host are not limited to the examples described above, and may be one of other interface protocols such as universal serial bus (USB), multi-media card (MMC), enhanced small disk interface (ESDI), integrated drive electronics (IDE), or the like.

According to an embodiment, the memory device 200 may include a data output circuit DOC for outputting requested data to the memory controller 100, in response to a read operation requested by the memory controller 100. The data output circuit DOC may include a clock boosting buffer 230 and a data output unit 250. As used herein, a "unit" may refer to a "circuit," or a "block." The memory device 200 further includes a delay fixing loop (or, delay-locked loop DLL) circuit for taking into account a delay in the memory device 200 and generating an internal clock signal CLK_IN synchronized with an external clock signal CLK_EXT. Additionally, the internal clock signal CLK_IN may be generated by using a power voltage VDD received from outside. Further, the memory device 200 may perform an operation requested by the memory controller 100, by using the power voltage VDD received from outside. For example, the memory device 200 may write data to a memory cell array or read data from the memory cell array by using the power voltage VDD. The power voltage VDD may be generated from a power voltage supplier included in the memory system 10, and the memory device 200 may receive a plurality of power voltages VDD having various voltage levels. For example, the memory device 200 may receive power voltages VDD having a voltage level of 1.1 V or 1.8 V from the power voltage supplier, and the internal clock signal CLK_IN may be generated by using the power voltage VDD having a voltage level of 1.1 V. In example embodiments, the memory device 200 may generate power voltages having various voltage levels, by increasing or decreasing a power voltage VDD received from outside, and perform an operation requested by the memory controller 100 by using the power voltages.

According to an embodiment, the block boosting buffer 230 may generate a boosted clock signal BCLK by using an internal clock signal CLK_IN and a boosting power voltage $V_{DD}'$. The boosting power voltage $V_{DD}'$ may be generated by a voltage generator using the power voltage $V_{DD}$, or received from outside (e.g., from the power voltage supplier). The boosting power voltage $V_{DD}'$ may have a voltage level different from that of the power voltage $V_{DD}$. For example, the boosting power voltage $V_{DD}'$ may have a voltage level greater than a voltage level of 1.1 V of a power voltage $V_{DD}$ which may be used to generate the internal clock signal CLK_IN.

The data output unit 250 may receive a boosted clock signal BCLK and operate in synchronization with the boosted clock signal BCLK, and thus, multiplex and output a plurality of data signals read from the memory cell array. The data output unit 250 may decrease an equivalent resistance of transistors, included in the data output unit 250 and configured to perform a multiplexing operation, by using a boosted clock signal BCLK having a high level voltage, which is increased to a level greater than that of the internal clock signal CLK_IN, and output data at a high speed by relieving a parasitic effect (e.g., reducing an equivalent resistance) of the data output unit 250 or the like.

As such, according to example embodiments, when the memory device 200 outputs read data to the memory controller 100, the memory device 200 may generate a boost clock signal BCLK by using a boosting power voltage $V_{DD}'$, and perform a multiplexing operation on a plurality of pieces of data by using a boosted clock signal BCLK. A detailed description thereof is to be described later.

Figure 2:
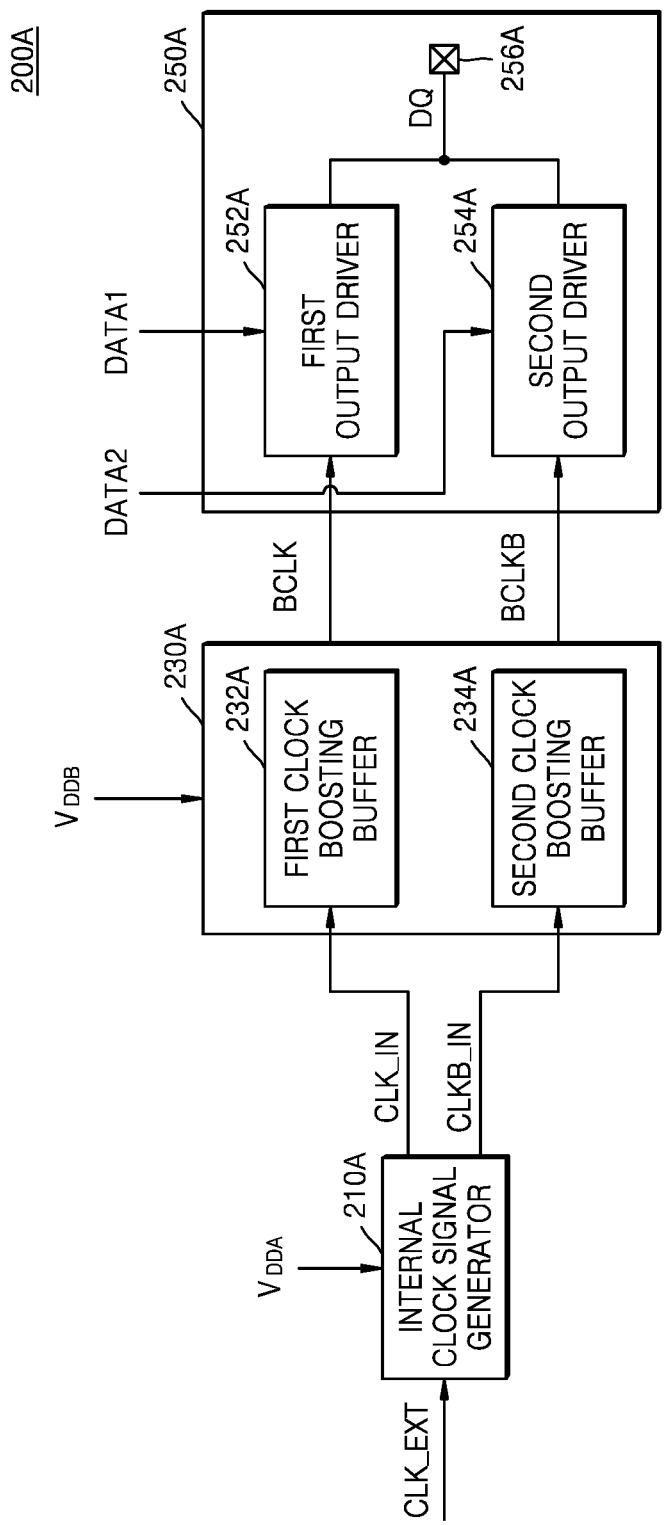
FIG. 2 is a block diagram of a memory device according to example embodiments.

FIG. 2 is a block diagram of a memory device 200A according to example embodiments. As shown in FIG. 2, the memory device 200A may include an internal clock signal generator 210A, a clock boosting buffer 230A, and a data output unit 250A. According to an embodiment, the internal clock signal generator 210A may generate internal clock signals CLK_IN and CLKB_IN having an opposite phase of the internal clock signal CLK_IN based on a received external clock signal CLK_EXT. The internal clock signal generator 210A may further include a delay fixing (or locked) loop circuit. The delay fixing loop circuit may control the internal clock signal CLK_IN, which is output outside of the memory device 200A, to be maintained in synchronization with the external clock signal CLK_EXT by compensating for a difference between phases of the internal clock signal CLK_IN, which may occur due to internal blocks in the memory device 200A. The internal clock signal generator 210A may generate internal clock signals CLK_IN and CLKB_IN by using a first power voltage $V_{DDA}$. For example, each of the internal clock signals CLK_IN and CLKB_IN may have a logic high level of the first power voltage $V_{DDA}$. According to example embodiments, the first power voltage $V_{DDA}$ may be a power voltage received from outside or generated by increasing or decreasing a power voltage received from outside. The internal clock signal generator 210A may generate an internal clock signal CLK_IN and an internal inverse clock signal CLKB_IN that is obtained by inverting the internal clock signal CLK_IN, and thus, provide the internal clock signal CLK_IN and the internal inverse clock signal CLKB_IN to the clock boosting buffer 230A. In example embodiments, the internal clock signal generator 210A may generate a plurality of internal clock signals CLK_IN having different phases from each other, for example, 90°, 180°, 270°, etc.

In example embodiments, the clock boosting buffer 230A may include a first clock boosting buffer 232A and a second clock boosting buffer 234A. A second power voltage $V_{DDB}$ may be provided to the first clock boosting buffer 232A and the second clock boosting buffer 234A. The first clock boosting buffer 232A and the second clock boosting buffer 234A may generate a boosted clock signal BCLK and a boosting inverse clock signal BCLKB, respectively obtained by boosting voltage levels of the internal clock signal CLK_IN and the internal inverse clock signal CLKB_IN. A voltage level of the second power voltage $V_{DDB}$ may be greater than that of the first power voltage $V_{DDA}$.

The data output unit 250A may include a first output driver 252A, a second output driver 254A, and an output pad 256A. The first output driver 252A may receive a first data signal DATA1 from a memory cell array. The first output driver 252A may synchronize the received first data signal DATA1 with a boosted clock signal BCLK, and thus, output the first data signal DATA1 to the output pad 256A. The second output driver 254A may receive a second data signal DATA2 from the memory cell array. The second output driver 254A may synchronize the received second data signal DATA2 with a boosting inverse clock signal BCLKB, and thus, output the first data signal DATA2 to the output pad 256A. The boosted clock signal BCLK may be a pulse signal having a constant frequency.

The boosting inverse clock signal BCLKB may be a pulse signal that has a same frequency as that of the boosted clock signal BCLK and has an inverse form of the boosted clock signal BCLK (i.e., out of phase by 180°). Accordingly, the first data signal DATA1 and the second data signal DATA2 may be multiplexed by the boosted clock signal BCLK and the boosted inverse clock signal BCLKB. An output data signal DQ may be generated by multiplexing the first data signal DATA1 and the second data signal DATA2. The output data signal DQ may have a same frequency as that of the boosted clock signal BCLK and the boosted inverse clock signal BCLKB. The output data signal DQ may be transmitted to another device via a channel connected to the output pad 256A. For example, the other device may be the memory controller 100 shown in FIG. 1, and the output data signal DQ may include data requested to be read from a host. A channel may refer to a data path for transmitting data. The channel may be implemented as a line or a bus. For example, a line or a bus may be implemented on or inside a printed circuit board (PCB). The data path may include an electrical path or an optical path. The optical path may include optical interconnection means. For example, the optical interconnection means may include optical fiber, an optical waveguide, or a medium for transmitting an optical signal.

In example embodiments, the memory device 200A is not limited to performing a multiplexing operation on the first data DATA1 and the second data DATA2. The internal clock signal generator 210A may generate a plurality of internal clock signals more than two internal clock signals which are controlled to have phases different from each other, so as to multiplex a plurality of pieces of data more than the first data DATA1 and the second data DATA2 shown in FIG. 2. For example, the clock boosting buffer 230A may generate a plurality of boosted clock signals more than two boosted clock signals. The data output unit 250A may multiplex a plurality of pieces of data by using the plurality of boosted clock signals, and output the plurality of pieces of data to the output pad 256A. Thus, the memory device 200A may operate at a higher frequency and a lower power by using the plurality of data signals (e.g., DATA1~DATAn), the plurality of internal clock signals (CLK_IN1~CLK_INm), and the plurality of boosted clock signals (BCLK1~BCLKm). The n and m are a positive integer greater than 2.

Figure 3:
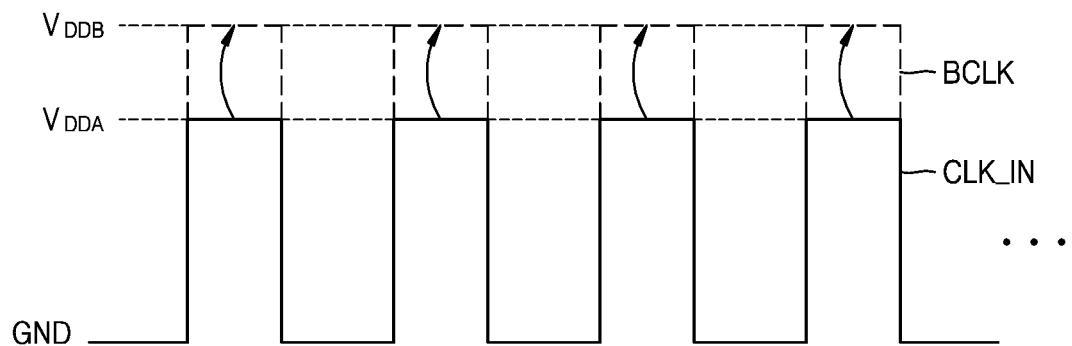
FIG. 3 is a graph showing a relation between a voltage level of an internal clock signal and a voltage level of a boosted clock signal, according to example embodiments.

FIG. 3 is a graph showing a relation between a voltage level of an internal clock signal CLK_IN and a voltage level of a boosted clock signal BCLK, according to example embodiments. As shown in FIG. 3, the internal clock signal CLK_IN is a signal generated by using a first power voltage $V_{DDA}$, and the boosted clock signal BCLK may be a signal generated by using a second power voltage $V_{DDB}$ having a voltage level greater than that of the first power voltage $V_{DDA}$. Accordingly, a high level of the boosted clock signal BCLK is greater than a high level of the internal clock signal CLK_IN, and a low level of the boosted clock signal BCLK may be same as that of the internal clock signal CLK_IN. Hereinafter, the boosted clock signal BLCK may be defined as a signal obtained by boosting the internal clock signal CLK_IN. Additionally, as a voltage level of the second power voltage $V_{DDB}$ increases, the internal clock signal CLK_IN may be boosted greatly. Thus, the boosted clock signal BCLK of which voltage level is increased may be generated.

If the data output unit 250A shown in FIG. 2 multiplexes the first data DATA1 and the second DATA2 based on the boosted clock signal BCLK shown in FIG. 3, an equivalent resistance of transistors included in the first output driver 252A and the second output driver 254A and configured to perform a multiplexing operation may be reduced. Accordingly, a size of the transistors may be reduced, and thus, an area of the memory device 200A may be reduced, and the output data signal DQ may be output at a high speed.

Figure 4:
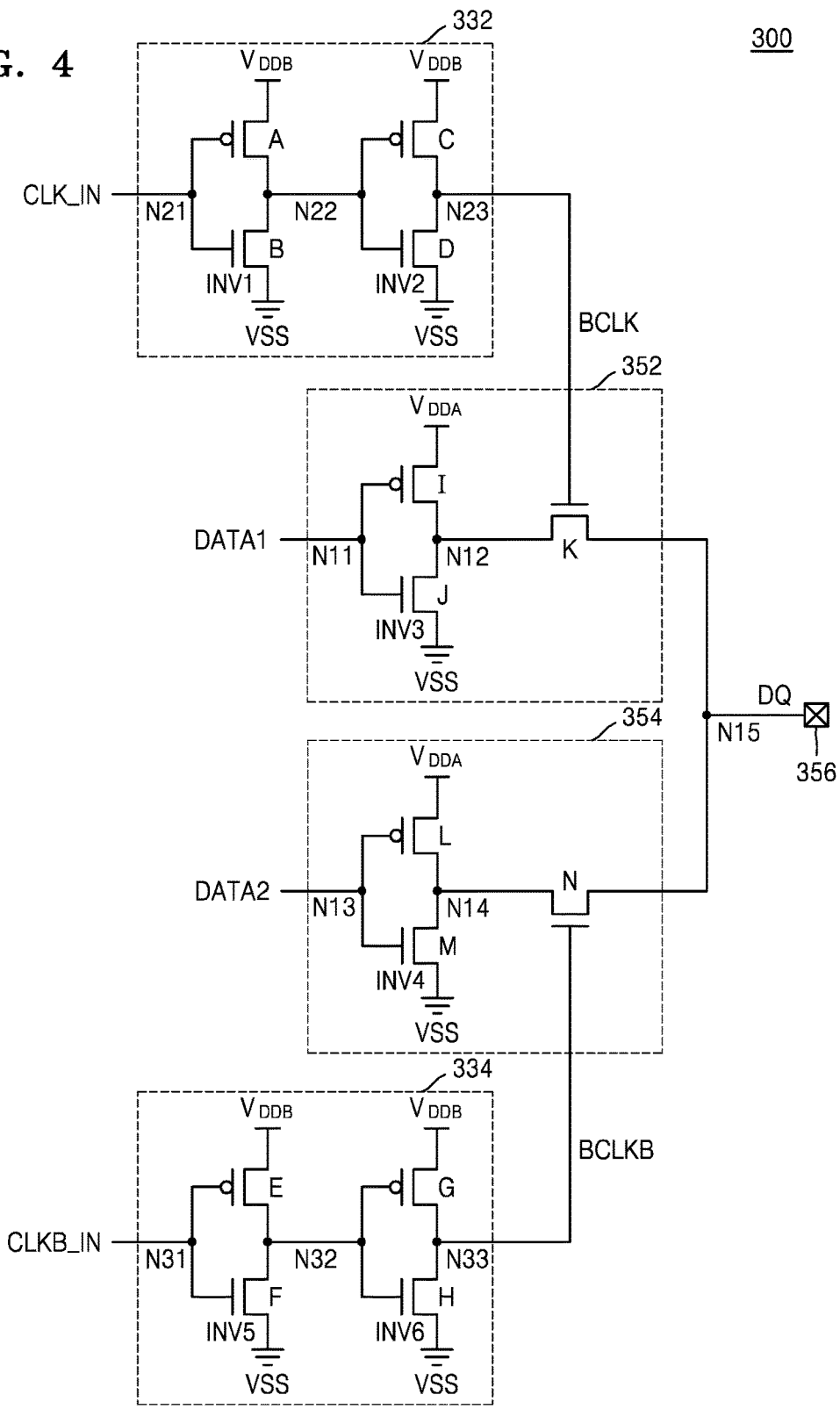
FIG. 4 is a detailed circuit diagram of a clock boosting buffer and a data output unit shown in FIG. 2 according to example embodiments.

FIG. 4 is a detailed circuit diagram of the clock boosting buffer 230A and the data output unit 250A which are shown in FIG. 2 according to example embodiments. As shown in FIG. 4, a memory device 300 may include a clock boosting buffer that includes a first clock boosting buffer 332 and a second clock boosting buffer 334, and a data output unit that includes a first output driver 352, a second output driver 354, and an output pad 356. As used herein, a "unit" may refer to a "circuit," or a "driver."

In example embodiments, the first clock boosting buffer 332 may include two inverters INV1 and INV2 and the second clock boosting buffer 334 may include two inverters INV5 and INV6. In example embodiments, each of the first clock boosting buffer 332 and the second clock boosting buffer 334 may include at least one inverter or a plurality of inverters more than two inverters.

The inverter INV1 of the first clock boosting buffer 332 may convert an internal clock signal CLK_IN having a logic high level of the first power voltage $V_{DDA}$ into a voltage of a node N22. The inverter INV2 of the first clock boosting buffer 332 may convert the voltage of the node N22 into a boosted clock signal BLCK having a logic high level of the second power voltage $V_{DDB}$ greater than the first power voltage $V_{DDA}$, and transmit the boosted clock signal BLCK to the first output driver 352. The inverter INV5 of the second clock boosting buffer 334 may convert an internal inverse clock signal CLKB_IN having a logic high level of the first power voltage $V_{DDA}$ into a voltage of a node N32. The inverter INV6 of the second clock boosting buffer 334 may convert the voltage of the node N32 into a boosting inverse clock signal BLCKB having a logic high level of the second power voltage $V_{DDB}$, and transmit the boosting inverse clock signal BLCKB to the second output driver 354.

The first clock boosting buffer 332 may include p-channel metal oxide semiconductor (PMOS) transistors A and C, and n-channel metal oxide semiconductor (NMOS) transistors B and D. The internal clock signal CLK_IN may be input to a gate of the PMOS transistor A and a gate of the NMOS transistor B via a node N21. The PMOS transistor A and the NMOS transistor B may be serially connected between a terminal of a second power voltage $V_{DDB}$ and a terminal of a ground voltage $V_{SS}$.

A source of the PMOS transistor A may be connected to the terminal of the second power voltage $V_{DDB}$ and a drain of the PMOS transistor A may be connected to the node N22. A source of the NMOS transistor B may be connected to the terminal of the ground voltage $V_{SS}$ and a drain of the NMOS transistor B may be connected to the node N22. The inverter INV1 of the first clock boosting buffer 332 performs an inverting operation on the internal clock signal CLK_IN via the PMOS transistor A and the NMOS transistor B, and thus, a first clock signal on the node N22 having an inverse phase and an increased voltage level, compared to those of the internal clock signal CLK_IN, may be generated. The first clock signal of the node N22 may be input to a gate of the PMOS transistor C and a gate of the NMOS transistor D via the node N22. The PMOS transistor C and the NMOS transistor D may be serially connected between the terminal of the second power voltage $V_{DDB}$ and the terminal of the ground voltage $V_{SS}$. A source of the PMOS transistor C may be connected to the terminal of the second power voltage $V_{DDB}$ and a drain of the PMOS transistor C may be connected to a node N23. A source of the NMOS transistor D may be connected to the terminal of the ground voltage $V_{SS}$ and a drain of the NMOS transistor D may be connected to the node N23. The inverter INV2 of the first clock boosting buffer 332 inverts the first clock signal via the PMOS transistor C and the NMOS transistor D, and thus, a boosted clock signal BCLK having an inverse phase, compared to that of the first clock signal, may be generated. The boosted clock signal BCLK may be output to the first output driver 352 via the node N23.

The second clock boosting buffer 334 may include PMOS transistors E and G, and NMOS transistors F and H. The internal inverse clock signal CLKB_IN may be input to a gate of the PMOS transistor E and a gate of the NMOS transistor F via a node N31. The PMOS transistor E and the NMOS transistor F may be serially connected between the terminal of the second power voltage $V_{DDB}$ and the terminal of the ground voltage $V_{SS}$.

A source of the PMOS transistor E may be connected to the terminal of the second power voltage $V_{DDB}$ and a drain of the PMOS transistor E may be connected to the node N32. A source of the NMOS transistor F may be connected to the terminal of the ground voltage $V_{SS}$ and a drain of the NMOS transistor F may be connected the node N32. The inverter INV5 of the second clock boosting buffer 334 inverts the internal inverse clock signal CLKB_IN via the PMOS transistor E and the NMOS transistor F, and thus, a second clock signal on the node N32 having an inverse phase and an increased voltage level, compared to those of the internal inverse clock signal CLKB_IN, may be generated. The second clock signal of the node N32 may be input to a gate of the PMOS transistor G and a gate of the NMOS transistor H via the node N32. The PMOS transistor G and the NMOS transistor H may be serially connected between the terminal of the second power voltage $V_{DDB}$ and the terminal of the ground voltage $V_{SS}$. A source of the PMOS transistor G may be connected to the terminal of the second power voltage $V_{DDB}$ and a drain of the PMOS transistor G may be connected to a node N33, and a source of the NMOS transistor H may be connected to the terminal of the ground voltage $V_{SS}$ and a drain of the NMOS transistor H may be connected to the node N33. The inverter INV6 of the second clock boosting buffer 334 inverts the second clock signal via the PMOS transistor G and the NMOS transistor H, and thus, a boosting inverse clock signal BCLKB having an inverse phase, compared to that of the second clock signal, may be generated. The boosting inverse clock signal BCLKB may be output to the second output driver 354 via the node N33.

The data output unit may transmit an output data signal DQ to outside of the memory device 300, generated by multiplexing a first data signal DATA1 and a second data signal DATA2 via the first output driver 352 and the second output driver 354, via the output pad 356. In example embodiments, the first output driver 352 may include an inverter INV3 and an NMOS switching transistor K. In example embodiments, the first output driver 352 may include one inverter or a plurality of inverters. In detail, the first output driver 352 may include a PMOS transistor I, an NMOS transistor J, and the NMOS switching transistor K. The first data signal DATA1 may be input to a gate of the PMOS transistor I and a gate of the NMOS transistor J via a node N11. The PMOS transistor I and the NMOS transistor J may be serially connected between the terminal of the first power voltage $V_{DDA}$ and the terminal of the ground voltage $V_{SS}$. A source of the PMOS transistor I may be connected to the terminal of the first power voltage $V_{DDA}$. A source of the NMOS transistor J may be connected to the terminal of the ground voltage $V_{SS}$. A drain of the PMOS transistor I and a drain of the NMOS transistor J may be connected to a node N12. A source of the NMOS transistor K may be connected to the node N12. A drain of the NMOS transistor K may be connected to a node N15.

In example embodiments, the second output driver 354 may include an inverter INV4 and an NMOS switching transistor N. In example embodiments, the second output driver 354 may include a plurality of inverters. In detail, the second output driver 354 may include a PMOS transistor L, an NMOS transistor M, and the NMOS switching transistor N. The second data signal DATA2 may be input to a gate of the PMOS transistor L and a gate of the NMOS transistor M via a node N13. The PMOS transistor L and the NMOS transistor M may be serially connected between the terminal of the first power voltage $V_{DDA}$ and the terminal of the ground voltage $V_{SS}$. A source of the PMOS transistor L may be connected to the terminal of the first power voltage $V_{DDA}$. A source of the NMOS transistor M may be connected to the terminal of the ground voltage $V_{SS}$. A drain of the PMOS transistor L and a drain of the NMOS transistor M may be connected to a node N14. A source of the NMOS transistor N may be connected to the node N15. A drain of the NMOS transistor N may be connected to the node N15.

A signal at the node N12 may be a signal obtained by inverting the first data signal DATA1. If the first data signal DATA1 is logical '0'(e.g., a logic low level), the PMOS transistor I may be turned on, thus, a signal at the node N12 may have a value of logical '1' (e.g., a logic high level). If the first data signal DATA1 is logical '1', the NMOS transistor J may be turned on, thus, a signal at the node N12 may have a value of logical '0'. A signal at the node N12 may be transmitted to the node N15 via the NMOS transistor K. The NMOS transistor K may be turned on or turned off according to the boosted clock signal BCLK. A signal at the node N12 may be transmitted to the node N15 according to a frequency of the boosted clock signal BCLK.

A signal at the node N14 may be a signal obtained by inverting the second data signal DATA2. If the second data signal DATA2 is logical '0', the PMOS transistor L may be turned on, thus a signal at the node N14 may have a value of logical '1'. If the second data signal DATA2 is logical '1', the NMOS transistor M may be turned on, thus, a signal at the node N14 may have a value of logical '0'. A signal at the node N14 may be transmitted to the node N15 via the NMOS transistor N. The NMOS transistor N may be turned on or turned off according to the boosting inverse clock signal BCLKB. A signal at the node N14 may be transmitted to the node N15 according to a frequency of the boosting inverse clock signal BCLKB.

The boosted clock signal BCLK and the boosting inverse clock signal BCLKB may have inverted pulse waveforms with respect to each other. Accordingly, the first data signal DATA1 and the second data signal DATA2 may be multiplexed by the NMOS transistor K and the NMOS transistor N. A multiplexed output data signal DQ may be output via the output pad 356. The output data signal DQ may have a same frequency as that of the boosted clock signals BCLK and BCLKB.

In the related art, if each of the NMOS transistors K and N having a small size is used, since an equivalent resistance increases, a data signal having a voltage level that a user wants may not be output. Accordingly, since each of the NMOS transistors K and N having a large size is used to obtain such an equivalent resistance so that a data signal having a voltage level that a user wants may be output, an area of a memory device may be large. According to embodiments of the memory device 300, the first data signal DATA1 and the second data signal DATA2 are multiplexed by using the boosted clock signals BCLK and BCLKB which have a logic high level of the second power voltage $V_{DDB}$. Thus, an equivalent resistance of the NMOS transistors K and N for performing a multiplexing operation may be reduced. Accordingly, since small NMOS transistors K and N compared to NMOS transistors K and N in the related art may be used, an area of the memory device 300 may be reduced, and the output data signal DQ may be accurately transceived at a high speed.

However, embodiments are not limited to the circuit diagram shown in FIG. 1, and various circuit configurations may be implemented so as to perform a multiplexing operation by using the boosted clock signal BCLK.

In example embodiments, the memory device 300 may include additional clock boosting buffers (e.g., 336~33$q$, q is a positive integer greater than 2) and additional output drivers (e.g., 356~35$q$) with additional switching transistors. In this case, the internal clock signal generator may generate additional internal clock signals (e.g., CLK_IN3~CLK_INm, m is a positive integer greater than 2) and the additional clock boosting buffers may generate additional boosted clock signals (e.g., BCLK3~BCLKm). For example, additional data signals (e.g., DATA3~DATAm) from the memory cell array may be transmitted to the additional output drivers. The switching transistors K and N and additional switching transistors may be connected to the node N15. Thus, the memory device 300 may operate at a higher frequency when the memory device 300 uses more clock boosting buffers and more output drivers than two.

Figure 5A:
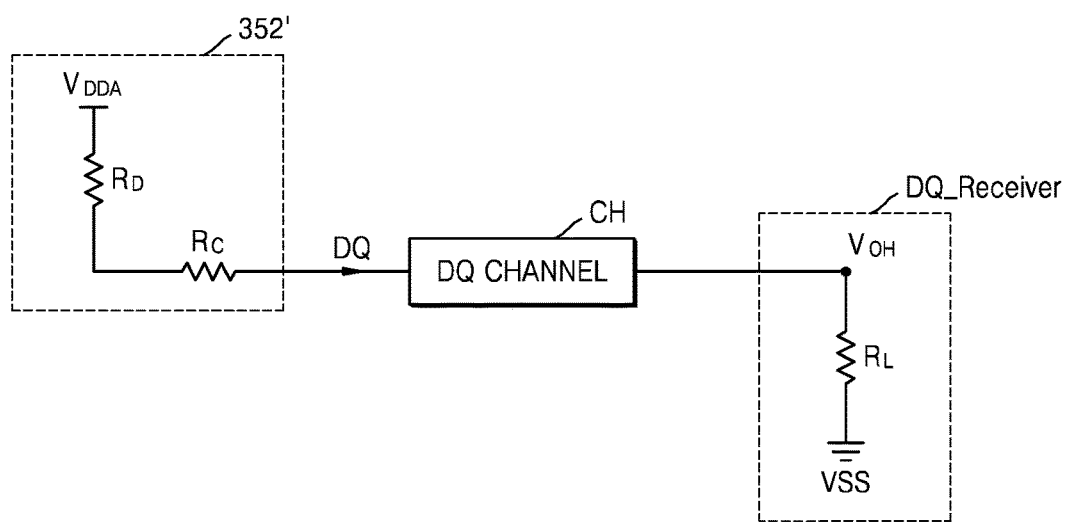
FIG. 5A illustrates a diagram showing an equivalent circuit of a path via which an output data signal passes.
Figure 5B:
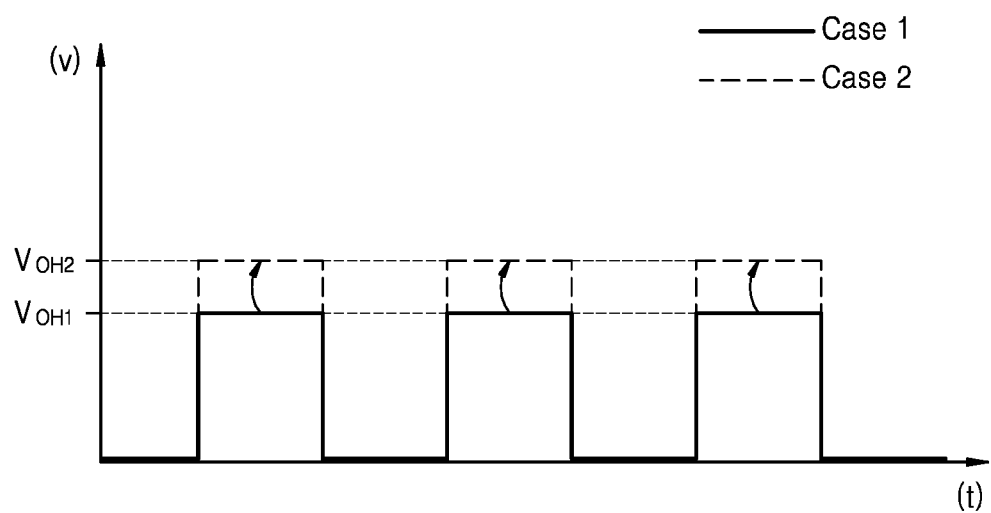
FIG. 5B is a graph showing a voltage received by an output data receiver according to example embodiments.

FIG. 5A illustrates a diagram showing an equivalent circuit of a path via which an output data signal DQ passes, and FIG. 5B is a graph showing a voltage received by an output data receiver according to example embodiments. As shown in FIG. 5A, the output data signal DQ may pass through a first output driver 352', an output data signal DQ channel CH, and an output data signal receiver DQ_Receiver. According to an embodiment, the output data signal DQ may pass through the PMOS transistor I and the NMOS transistor K included in the first output driver 352 shown in FIG. 4. A first equivalent resistance $R_D$ may correspond to an equivalent resistance of the PMOS transistor I, and a second equivalent resistance $R_C$ may correspond to an equivalent resistance of the NMOS transistor K. The output data signal receiver DQ_Receiver may be included in the memory controller 100 shown in FIG. 1, and an equivalent resistance of, for example, transistors included in the output data signal receiver DQ_Receiver may correspond to a third equivalent resistance $R_L$. A reception voltage $V_{OH}$ is a voltage applied to the third equivalent resistance $R_L$ of the output data signal receiver DQ_Receiver, and may represent a voltage level of the output data signal DQ at the output data signal receiver DQ_Receiver. The output data signal DQ needs to have a voltage level equal to or greater than a predetermined voltage level at the output data signal receiver DQ_Receiver. For example, if a voltage level of the output data signal DQ is less than the predetermined voltage level, the memory controller 100 shown in FIG. 1 may not accurately sense the output data signal DQ.

Referring to FIGS. 4 and 5B, the first case Case1 represents a voltage level $V_{OH1}$ of an output data signal DQ obtained when a multiplexing operation is performed on a first data signal DATA1 and a second data signal DATA2 by using an internal clock signal CLK_IN and an internal inverse clock signal CLKB_IN that are generated by using a first power voltage $V_{DDA}$. For example, the first case Case1 shows a case when sources of the PMOS transistors A, C, E, and G included in the boosting clock buffers 332 and 334, shown in FIG. 4, are connected to a terminal of the first power voltage $V_{DDA}$. A second case Case2 represents a voltage level $V_{OH2}$ of an output data signal DQ obtained when a multiplexing operation is performed on the first data signal DATA1 and the second data signal DATA2 by a boosted clock signal BCLK and a boosted inverse clock signal BCLKB that are generated by using a second power voltage $V_{DDB}$ having a voltage level greater than a voltage level of the first power voltage $V_{DDA}$. For example, if a multiplexing operation is performed by using the boosted clock signal BCLK and the boosted inverse clock signal BCLKB, a second equivalent resistance $R_C$ may decrease compared to when a multiplexing operation is performed by using the internal clock signal CLK_IN and the internal inverse clock signal CLKB_IN. Accordingly, a voltage level $V_{OH2}$ of the output data signal DQ in the second case Case2 may be greater than a voltage level $V_{OH1}$ of the output data signal DQ in the first case Case1.

In example embodiments, the memory device 300 may increase a voltage level $V_{OH2}$ of the output data signal DQ, by performing a multiplexing operation by using the boosted clock signal BCLK. Thus, the memory controller 100 shown in FIG. 1 may accurately sense the received output data signal DQ.

Figure 6:
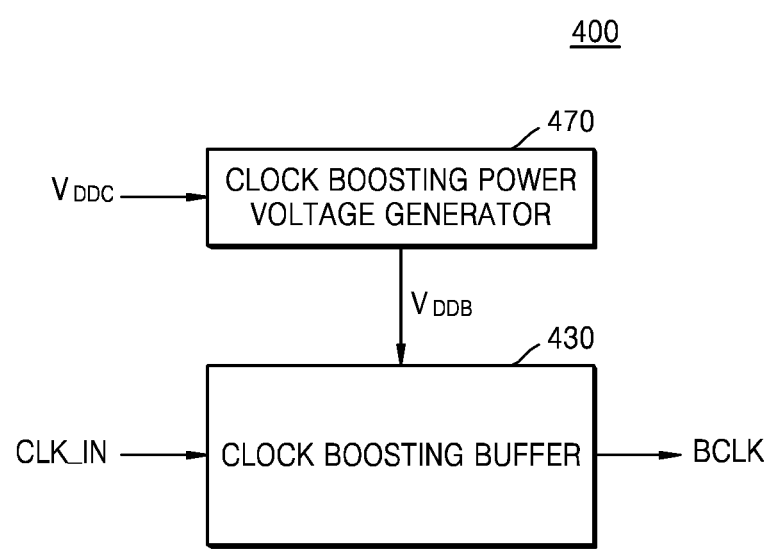
FIG. 6 is a block diagram of a memory device according to example embodiments.

FIG. 6 is a block diagram of a memory device 400 according to example embodiments. As shown in FIG. 6, the memory device 400 may further include a clock boosting power voltage generator 470 compared to the memory device 200A shown in FIG. 2. The clock boosting power voltage generator 470 may receive a third power voltage $V_{DDC}$ from outside, and generate a second power voltage $V_{DDB}$ by using the third power voltage $V_{DDC}$. A voltage level of the second power voltage $V_{DDB}$ may be less than a voltage level of the third power voltage $V_{DDC}$. According to an embodiment, the clock boosting power voltage generator 470 may include at least one resistance device, and generate the second power voltage $V_{DDB}$ by decreasing the third power voltage $V_{DDC}$ by using the at least one resistance device. In example embodiments, the clock boosting power voltage generator 470 may include a low dropout (LDO) regulator, and generate the second power voltage $V_{DDB}$ by regulating the third power voltage $V_{DDC}$ by using the LDO regulator. The clock boosting buffer 430 may generate the boosted clock signal BCLK by boosting the internal clock signal CLK_IN by using the second power voltage $V_{DDB}$.

Figure 7A:
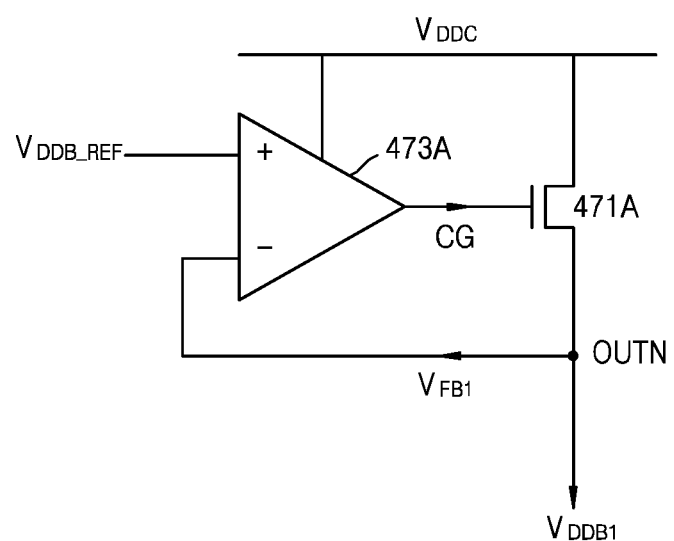
FIGS. 7A and 7B are circuit diagrams of a clock boosting power voltage generator according to example embodiments.
Figure 7B:
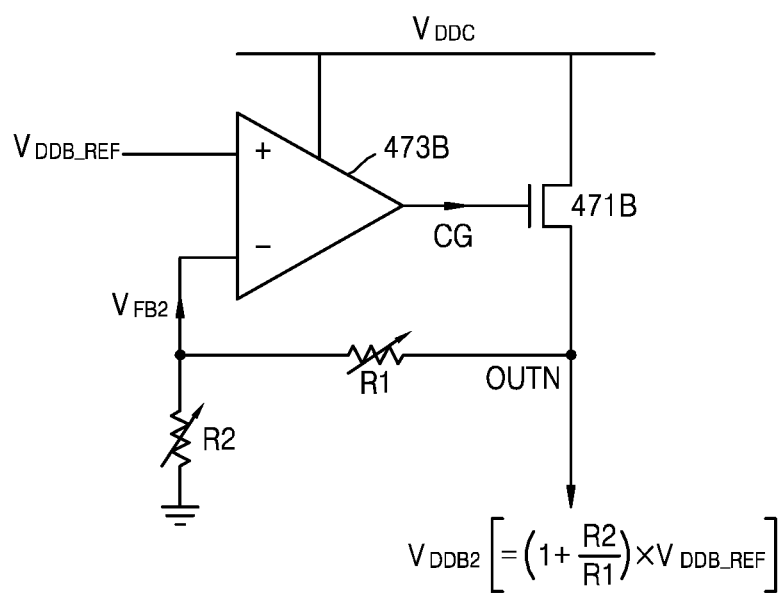
Figure 7C:
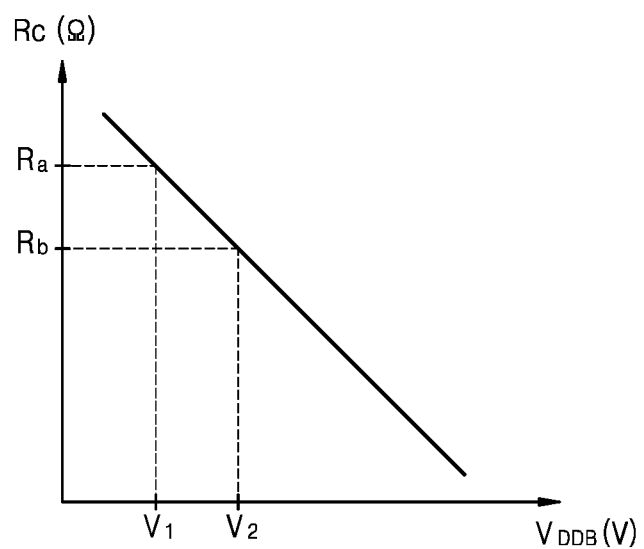
FIG. 7C illustrates a relation diagram showing a relation between a second equivalent resistor and a second power voltage shown in FIG. 5A according to example embodiments.

FIGS. 7A and 7B are circuit diagrams of clock boosting power voltage generators 470A and 470B according to example embodiments. FIG. 7C illustrates a relation diagram showing a relation between a second equivalent resistor and a second power voltage shown in FIG. 5A according to example embodiments. As shown in FIG. 7A, according to embodiments, the clock boosting power voltage generator 470A may include a pass transistor 471A and a comparison amplifier 473A. An end of the pass transistor 471A may be connected to a terminal of a third power voltage $V_{DDC}$, and the other end thereof may be connected to an output node OUTN. The pass transistor 471A may be an NMOS transistor. When the pass transistor 471A is turned on, the third power voltage $V_{DDC}$ at the end of the pass transistor 471A may be decreased by a predetermined voltage, and thus, a second power voltage $V_{DDB1}$ may be provided to an output node OUTN at the other end of the pass transistor 471A. However, the pass transistor 471A is not limited thereto, and may be implemented as a PMOS transistor.

The comparison amplifier 473A may control the pass transistor 471A by generating a gate signal CG corresponding to a difference between a reference voltage $V_{DDB\_REF}$ and a feedback voltage $V_{FB1}$ of the output node OUTN. The comparison amplifier 473A may control the pass transistor 471A so that the reference voltage $V_{DDB\_REF}$ becomes identical to the feedback voltage $V_{FB1}$. Accordingly, the clock boosting power voltage generator 470A may generate the second power voltage $V_{DDB1}$ that is identical to the reference voltage $V_{DDB\_REF}$ as a target voltage. According to example embodiments, the clock boosting power voltage generator 470A may adjust a voltage level of the second power voltage $V_{DDB1}$ that is being generated by adjusting a voltage level of the reference voltage $V_{DDB\_REF}$. The reference voltage $V_{DDB\_REF}$ may be generated by using a power voltage received from the outside.

As shown in FIG. 7B, according to example embodiments, the clock boosting power voltage generator 470B may include a pass transistor 471B, a comparison amplifier 473B, and variable resistance devices R1 and R2. An end of the pass transistor 471B may be connected to a terminal of a third power voltage $V_{DDC}$, and the other end of the pass transistor 471B may be connected to an output node OUTN. The pass transistor 471B may be an NMOS transistor. When the pass transistor 471B is turned on, the third power voltage $V_{DDC}$ at the end of the pass transistor 471B may be decreased by a predetermined voltage, and thus, a second power voltage $V_{DDB2}$ may be provided to an output node OUTN at the other end of the pass transistor 471B. However, the pass transistor 471B is not limited thereto, and may be implemented as a PMOS transistor.

The comparison amplifier 473B may control the pass transistor 471B by generating a gating signal CG corresponding to a difference between the reference voltage $V_{DDB\_REF}$ and the feedback voltage $V_{FB2}$. The feedback voltage $V_{FB2}$ may have a voltage level identical to a voltage obtained by distributing the second power voltage $V_{DDB2}$ at a certain rate by using variable resistance devices R1 and R2. The comparison amplifier 473B may control the pass transistor 471B so that the reference voltage $V_{DDB\_REF}$ is identical to the feedback voltage $V_{FB2}$. Accordingly, the clock boosting power voltage generator 470B may generate the second power voltage $V_{DDB2}$, obtained when the reference voltage $V_{DDB\_REF}$ becomes identical to the feedback voltage $V_{FB2}$, as a target voltage. According to example embodiments, the clock boosting power voltage generator 470B may adjust a voltage level of a generated second power voltage $V_{DDB2}$ that is being generated by adjusting a ratio between the variable resistance devices R1 and R2. According to an embodiment, the second power voltage may be according to the following equation.

$$V_{DDB2}=(1+R2/R1)\times V_{DDB\_REF}$$

As an example of the equation shown above, when a ratio of the variable resistance device R2 to the variable resistance device R1 is increased, a voltage level of the second power voltage $V_{DDB2}$ may be increased. When a ratio of the variable resistance device R2 to the variable resistance device R1 is reduced, a voltage level of the second power voltage $V_{DDB2}$ may be reduced.

Referring to FIG. 7C, the second power voltage $V_{DDB}$ and the second equivalent resistance $R_C$ that is shown in FIG. 5A may be inversely proportional to each other. For example, when the second power voltage $V_{DDB}$ has a first voltage level V1, the second equivalent resistance $R_C$ may have a first resistance value Ra. When the second power voltage $V_{DDB}$ has a second voltage level V2 greater than the first voltage level V1, the second resistance $R_C$ may have a second resistance value Rb less than the first resistance value Ra. In example embodiments, the clock boosting power voltage generators 470A and 470B may generate a second power voltage $V_{DDB}$ having various voltage levels according to a resistance value of the second equivalent resistance Rc. In example embodiments, the memory device may further include an equivalent resistance detector for detecting a resistance value of the second equivalent resistance $R_C$. The memory device may adjust a voltage level of the second power voltage $V_{DDB}$, by controlling the clock boosting power voltage generators 470A and 470B according to a result of detecting a resistance value of the second equivalent resistance $R_C$. For example, the clock boosting power voltage generators 470A and 470B may be controlled to generate a second power voltage $V_{DDB}$ having a higher voltage level compared to when a resistance value of the second equivalent resistance $R_C$ is high.

In example embodiments, referring to FIG. 4, the first clock boosting buffer 332 and the second clock boosting buffer 334 may generate a boosted clock signal BCLK and a boosting inverse clock signal BCLKB by using a second power voltage $V_{DDB}$ that has various voltage levels according to a resistance value of an equivalent resistance of at least one transistor selected from the group consisting of the NMOS transistors K and N included respectively in the first clock boosting buffer 332 and the second clock boosting buffer 334. For example, a voltage level of a second power voltage $V_{DDB}$ provided to the first clock boosting buffer 332 and a voltage level of a second power voltage $V_{DDB}$ provided to the second clock boosting buffer 334 may be separately adjusted. Accordingly, a voltage level of the second power voltage $V_{DDB}$ provided to the first clock boosting buffer 332 and a voltage level of a second power voltage $V_{DDB}$ provided to the second clock boosting buffer 334 may be identical to, or different from each other.

Figure 8:
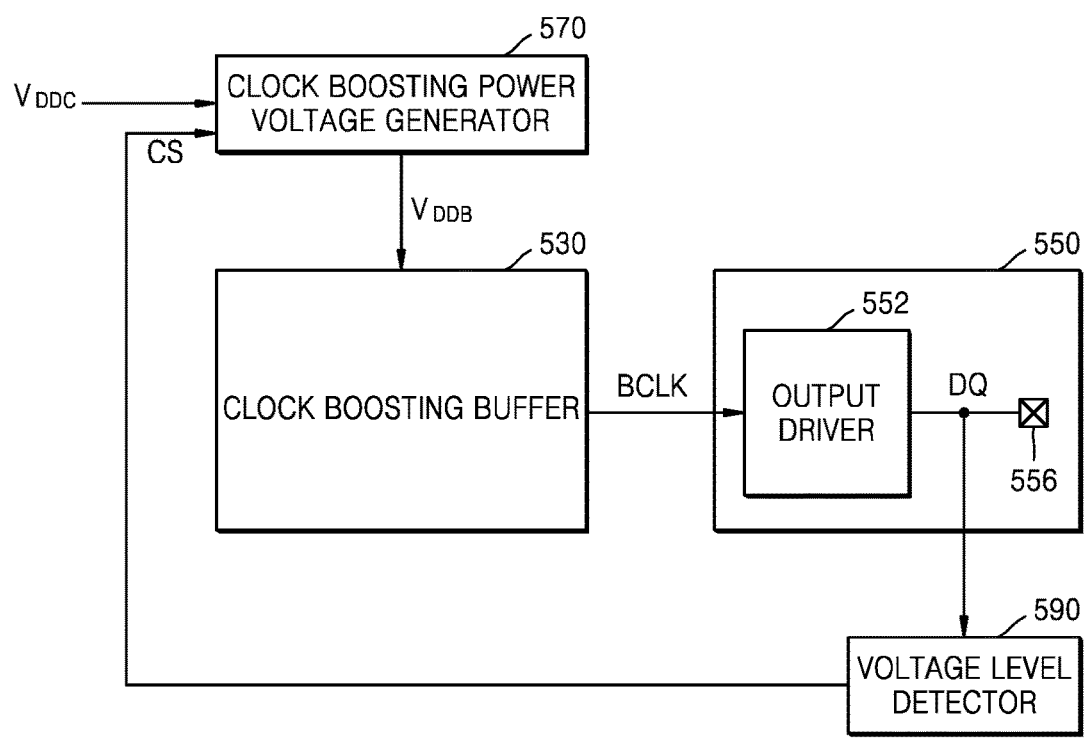
FIG. 8 is a block diagram of a memory device according to example embodiments.

FIG. 8 is a block diagram of a memory device 500 according to example embodiments. As shown in FIG. 8, the memory device 500 may include a clock boosting buffer 530, a data output unit 550, a clock boosting power voltage generator 570, and a voltage level detector 590.

The data output unit 550 may include an output driver 552 that includes a plurality of output drivers, and an output pad 556 from which an output data signal DQ is output. The voltage level detector 590 may detect a voltage level of the output data signal DQ at an internal node of the data output unit 550 connected to the output pad 556. The output data signal DQ may be accurately transmitted to a data receiver when a voltage level of the output data signal DQ at the internal node of the data output unit 550 is equal to or greater than a reference voltage level. For example, the reference voltage may transfer to the clock boosting power voltage generator 570 or may be generated in the clock boosting power voltage generator 570. Accordingly, the voltage level detector 590 may provide a voltage level control signal CS to the clock boosting power voltage generator 570. Thus, the voltage level detector 590 may control the clock boosting power voltage generator 570 to generate a second power voltage $V_{DDB}$ having a voltage level greater than that of a second power voltage which was generated previously, when a voltage level of the output data signal DQ is less than a reference voltage level, and generate a second power voltage $V_{DDB}$ having a voltage level less than that of a second power voltage which was generated previously, when a voltage level of the output data signal DQ is greater than the reference voltage level.

The clock boosting buffer 530 may generate a boosted clock signal BCLK by using a second power voltage $V_{DDB}$ of which voltage level is controlled, and provide the generated boosted clock signal BCLK to the data output unit 550. The data output unit 550 may generate an output data signal DQ having a voltage level equal to or greater than the reference voltage level, by multiplexing a plurality of pieces of data by using the boosted clock signal BCLK. According to example embodiments, the output data signal DQ may be accurately transceived at a high speed by using the memory device 500.

Figure 9:
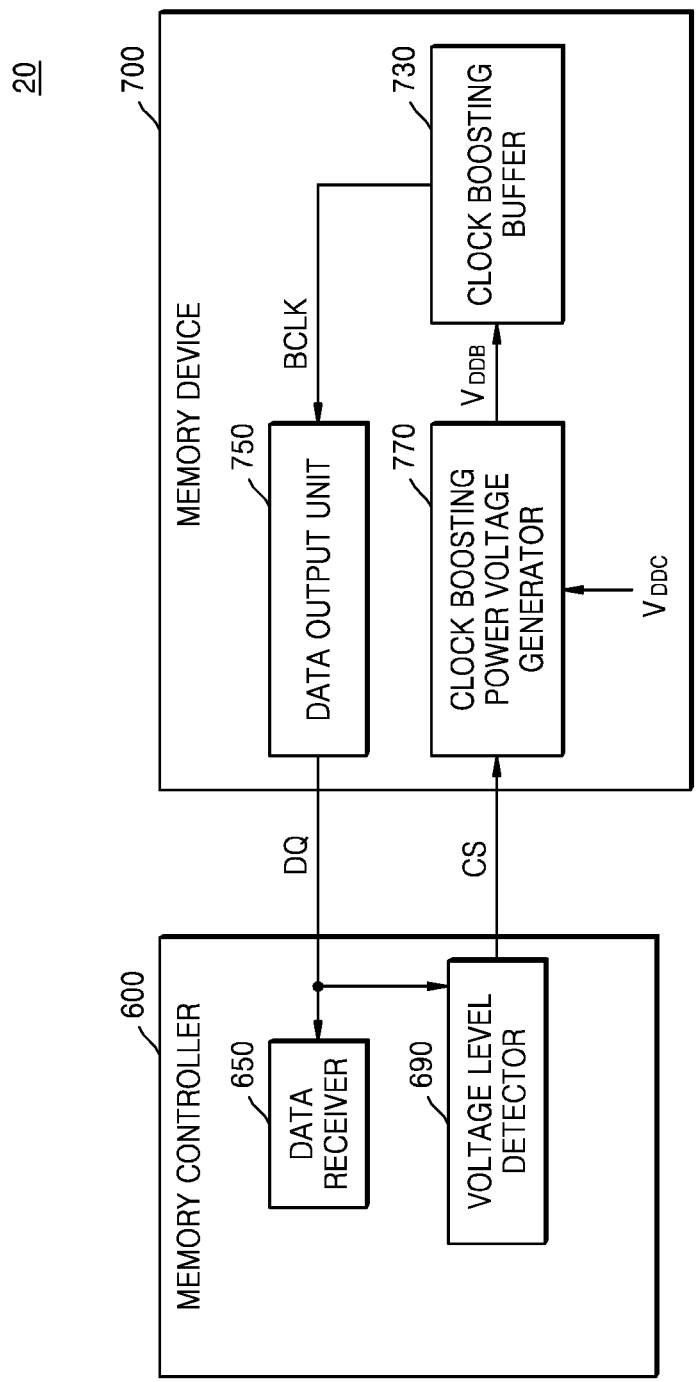
FIG. 9 is a block diagram of a memory system according to example embodiments.

FIG. 9 is a block diagram of a memory system 20 according to example embodiments. As shown in FIG. 9, the memory system 20 may include a memory controller 600 and a memory device 700. The memory controller 600 may include a data receiver 650 and a voltage level detector 690. The memory device 700 may include a clock boosting buffer 730, a data output unit 750, and a clock boosting power voltage generator 770. FIG. 9 shows an embodiment in which the voltage level detector 690 is included in the memory controller 600, unlike the voltage level detector 590 shown in FIG. 8.

The voltage level detector 690 may detect a voltage level of the output data signal DQ at a reception end connected to the data receiver 650 of the memory controller 600. When a voltage level of the output data signal DQ at the reception end is greater than a reference voltage level, the output data signal DQ may be accurately received, and the memory controller 600 may accurately sense the output data signal DQ. A voltage level of the output data signal DQ at the reception end may be identical to a voltage level of the reception voltage shown $V_{OH}$ in FIG. 5A. The voltage level detector 690 may provide a voltage level control signal CS to the clock boosting power voltage generator 770. Thus, the voltage level detector 690 may control the clock boosting power voltage generator 770 to generate a second power voltage $V_{DDB}$ having a voltage level greater than that of a second power voltage $V_{DDB}$ which was generated previously, when a voltage level of the output data signal DQ is less than the reference voltage level, and to generate a second power voltage $V_{DDB}$ having a voltage level less than that of a second power voltage $V_{DDB}$ which was generated previously, when a voltage level of the output data signal DQ is greater than the reference voltage level. The voltage level control signal CS generated by the voltage level detector 690 may be included in a command signal provided by the memory controller 600 to the memory device 700.

The clock boosting buffer 730 may generate a boosted clock signal BCLK by using a second power voltage $V_{DDB}$ of which voltage level is controlled, and provide the generated boosted clock signal BCLK to the data output unit 750. The data output unit 750 may generate an output data signal DQ, by multiplexing a plurality of pieces of data by using the boosted clock signal BCLK. Thus, a voltage level of the output data signal DQ, received by the data receiver 650, may become equal to or greater than the reference voltage level. According to embodiments, the memory controller 600 may accurately receive and sense the output data signal DQ at a high speed.

Figure 10A:
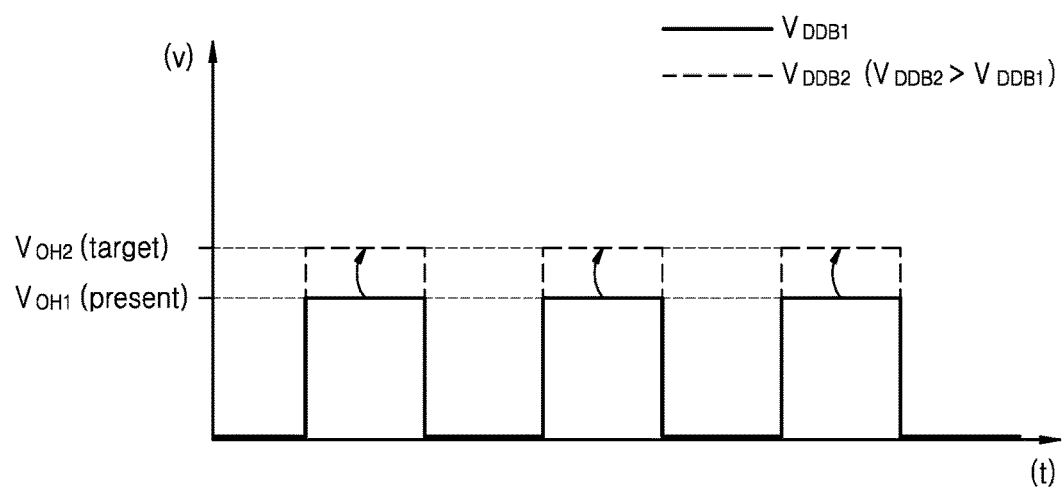
FIGS. 10A and 10B are graphs showing a voltage level of an output data signal at a reception end based on a second power voltage, according to example embodiments.
Figure 10B:
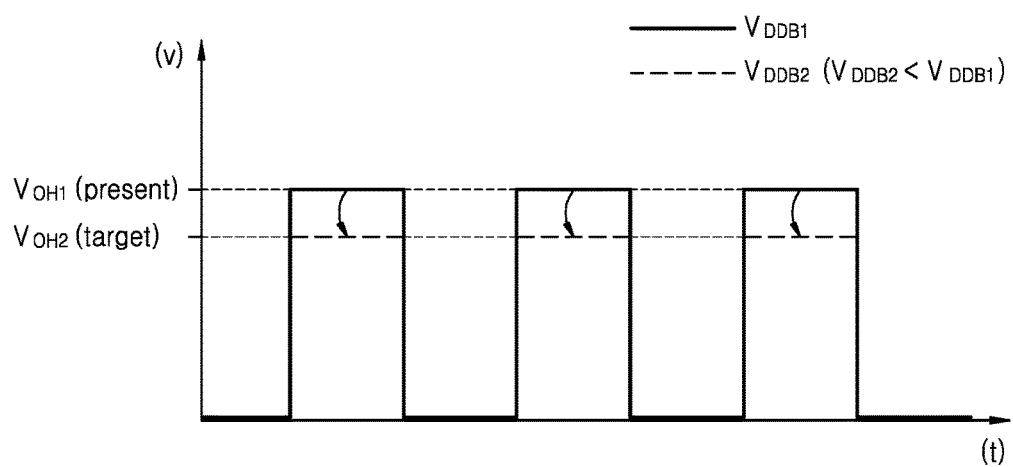

FIGS. 10A and 10B are graphs showing a voltage level of an output data signal DQ at a reception end based on a second power voltage $V_{DDB1}$ according to example embodiments.

As shown in FIGS. 9 and 10A, the memory system 20 may control a voltage level of the output data signal DQ at a reception end to be equal to or greater than a reference voltage level, so as to accurately receive and sense the output data signal DQ when a previous voltage level of the output data signal DQ at the reception end is less than the reference voltage level. For example, when a boosted clock signal BCLK is generated by using a second power voltage $V_{DDB2}$ having a voltage level greater than that of a second power voltage $V_{DDB1}$ which was obtained previously, and the output data signal DQ is generated by using the generated boosted clock signal BCLK having a logic high level of the second power voltage $V_{DDB2}$, a voltage level $V_{OH2}$ of the output data signal DQ at the reception end, which is detected by the voltage level detector 690, may be greater than a voltage level $V_{OH1}$ of the output data signal DQ which was obtained previously. In example embodiments, the memory system 20 may control the output data signal DQ so that a voltage level of the output data signal DQ at the reception end has a target voltage level that is equal to or greater than the reference voltage level, by adjusting a voltage level of the second power voltage $V_{DDB}$.

As shown in FIGS. 9 and 10B, the memory system 20 may control a voltage level of the output data signal DQ to be identical or similar to the reference voltage level, so as to reduce power consumed when a previous voltage level of an output data signal DQ at the reception end is greater than the reference voltage level. When a boosted clock signal BCLK is generated by using a second power voltage $V_{DDB2}$ having a voltage level less than a voltage level of a second power voltage $V_{DDB1}$ which was previously generated, and the output data signal DQ is generated by using the generated boosted clock signal BCLK having a logic high level of the second power voltage $V_{DDB2}$, a voltage level $V_{OH2}$ of the output data signal DQ at the reception end, which is detected by the voltage level detector 690, may be less than a voltage level $V_{OH1}$ of the output data signal DQ which was previously generated. In example embodiments, the memory system 20 may control the output data signal DQ so that a voltage level of the output data signal DQ at the reception end has a target voltage level, by adjusting a voltage level of the second power voltage $V_{DDB}$.

Figure 11:
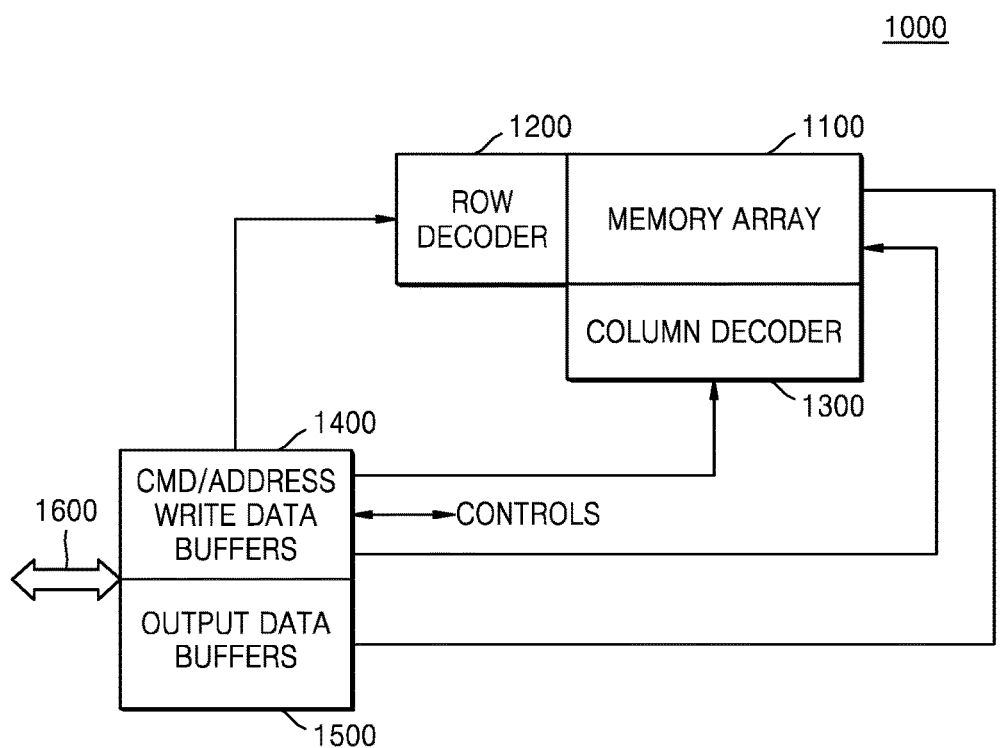
FIG. 11 is a block diagram showing an example application using a memory device according to certain embodiments.

FIG. 11 is a block diagram showing an example application using a memory device 1000 according to certain embodiments. As shown in FIG. 11, the memory device 1000 may include a memory array 1100, a row decoder 1200, a column decoder 1300, command/address/write data buffers 1400, and output data buffers 1500. The memory array 1100 may include a plurality of dynamic random access memory (DRAM) memory cells, a plurality of static random access memory (SRAM) memory cells, a plurality of not-and (NAND)-type electrically erasable programmable read-only memory (EEPROM) cells, or a plurality of not or (NOR)-type EEPROM cells. The command/address/write data buffers 1400 may perform buffering by receiving a command, an address, and write data. A row decoder 1200 may select a row in the memory array 1100 by decoding a row address. A column decoder 1300 may select a column in the memory array 1100 by decoding a column address. The output data buffers 1500 may buffer data output from the memory array 1100. In a read operation mode, the output data buffers 1500 may output data to an input/output bus 1600.

According to certain embodiments, the output data buffers 1500 may include the data output circuit DOC shown in FIG. 1. The data output circuit DOC may generate a boosted clock signal by using a second power voltage having a voltage level greater than that of a first power voltage, and generate an output data signal by multiplexing a plurality of pieces of data by using a boosted clock signal. Thus, The memory device 1000 may transmit an output data signal to a data receiver in the memory controller at a high speed, and an area of the memory device 1000 when the memory device 1000 is designed may be reduced.

Figure 12:
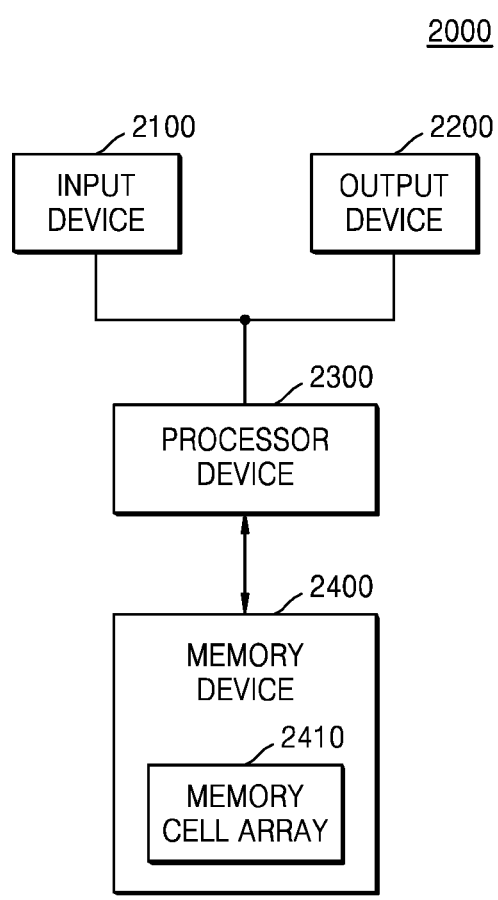
FIG. 12 is a block diagram showing an electronic system that includes an output circuit according to certain embodiments.

FIG. 12 is a block diagram showing an electronic system 2000 that includes an output circuit according to certain embodiments. As shown in FIG. 12, the electronic system 2000 includes an input device 2100, an output device 2200, a processor device 2300, and a memory device 2400 including a memory cell array 2410. According to certain embodiments, the memory device 2400 may include the data output circuit DOC shown in FIG. 1. The data output circuit DOC may generate a boosted clock signal by using a second power voltage having a voltage level greater than that of a first power voltage, and generate an output data signal by multiplexing a plurality of pieces of data by using a boosted clock signal. Thus, the memory device 2400 may transmit an output data signal at a high speed, and an area of the memory device 2400 when the memory device 2400 is designed may be reduced. In example embodiments, the memory device 2400 may include a clock boosting power voltage generator 470 that generates a second power voltage and is shown in FIG. 6. The processor device 2300 may control the input device 2100, the output device 2200, and the memory device 2400 via an interface respectively corresponding to the input device 2100, the output device 2200, and the memory device 2400.

Figure 13:
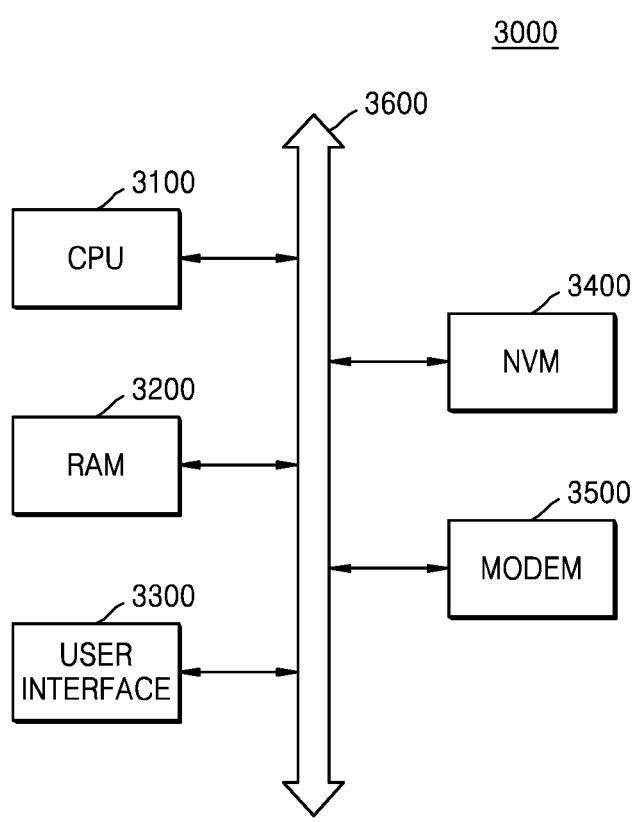
FIG. 13 is a block diagram of a computing system that includes a random access memory (RAM) and a non-volatile memory device, which both include an output circuit, according to certain embodiments.

FIG. 13 is a block diagram of a computing system 3000 that includes a random access memory (RAM) 3200 and a non-volatile memory device 3400, which both include an output circuit, according to certain embodiments. The computing system 3000 may include a central processing unit (CPU) 3100 electrically connected to a system bus 3600, the RAM 3200, a user interface 3300, a modem 3500 such as a baseband chipset, and a non-volatile memory device 3400.

If the computer system 3000 is a mobile device, a battery for supplying an operation voltage to the computing system 3000 may be further provided. Although not shown in the drawing, it may be obvious to one of ordinary skill in the art that an application chipset, a camera image processor (CIP), mobile DRAM may be further provided to the computing system 3000.

According to certain embodiments, the RAM 3200 or the non-volatile memory device 3400 may include the data output circuit DOC shown in FIG. 1. The data output circuit DOC may generate a boosted clock signal by using a second power voltage having a voltage level greater than that of a first power voltage, and generate an output data signal by multiplexing a plurality of pieces of data by using the boosted clock signal. Thus, the RAM 3200 or the non-volatile memory device 3400 may transmit an output data signal at a high speed, and an area of the RAM 3200 or the non-volatile memory device 3400 when the RAM 3200 or the non-volatile memory device 3400 is designed may be reduced. In example embodiments, the RAM 3200 or the non-volatile memory device 3400 may include the clock boosting power voltage generator 470 that generates a second power voltage and is shown in FIG. 6.

It may be understood that the exemplary embodiments described therein should be considered in a descriptive sense only and not for purposes of limitation. While the present disclosure has been particularly shown and described with reference to embodiments thereof, it will be understood that various changes in form and details may be made therein without departing from the spirit and scope of the following claims.

What is claimed is:

1. A memory device including a data output circuit configured to multiplex a plurality of data signals read from a memory cell array, the data output circuit comprising:
a clock boosting circuit configured to receive a plurality of internal clock signals generated based on a first power voltage, and to generate a plurality of boosted clock signals by boosting the plurality of internal clock signals based on a second power voltage having a voltage level greater than that of the first power voltage; and
a data output driver configured to multiplex and output the plurality of data signals synchronized with the boosted clock signals,
wherein a low level of each of the boosted clock signals is the same as a low level of each of the internal clock signals, and a high level of each of the boosted clock signals is greater than a high level of each of the internal clock signals.

2. The memory device of claim 1, wherein the clock boosting circuit includes at least one inverter configured to receive the second power voltage and a ground voltage and inverts one of the received internal clock signals.

3. The memory device of claim 1, further comprising:
a clock boosting power voltage generator configured to receive a third power voltage greater than the second power voltage, to generate the second power voltage, and to provide the second power voltage to the clock boosting circuit.

4. The memory device of claim 3, wherein the clock boosting power voltage generator includes a low dropout (LDO) regulator configured to regulate the second power voltage.

5. The memory device of claim 4, wherein the clock boosting power voltage generator includes:
an output node connected to the clock boosting circuit;
a comparison amplifier configured to compare a voltage of the output node to a reference voltage; and
a pass transistor configured to receive the third power voltage, and to apply the second power voltage based on a result of the comparison.

6. The memory device of claim 3, further comprising:
a voltage level detector configured to detect a voltage level of each of the data signals output from the data output driver, and control the clock boosting power voltage generator to change a voltage level of the second power voltage based on the detected voltage level.

7. The memory device of claim 6, wherein, when the detected voltage level is less than a reference voltage level, the voltage level detector controls the clock boosting power voltage generator to generate the second power voltage having a voltage level greater than that of the second power voltage which was previously generated, and
wherein, when the detected voltage level is greater than a reference voltage level, the voltage level detector controls the clock boosting power voltage generator to generate the second power voltage having a voltage level less than that of the second power voltage which was previously generated.

8. The memory device of claim 3, wherein the clock boosting power voltage generator is configured to determine a voltage level of the second power voltage based on a voltage level control signal received from outside of the memory device.

9. The memory device of claim 1, wherein the clock boosting circuit includes:
a first clock boosting buffer configured to receive a first internal clock signal of the plurality of internal clock signals, the first internal clock signal having a logic high level of the first power voltage, and to generate a first boosted clock signal of the plurality of the boosted clock signals, the first boosted clock signal having a logic high level of the second power voltage; and a second clock boosting buffer configured to receive a second internal clock signal of the plurality of internal clock signals, the second internal clock signal having a logic high level of the first power voltage, and to generate a second boosted clock signal of the plurality of the boosted clock signals, the second boosted clock signal having a logic high level of the second power voltage, and wherein the data output driver includes:

a first output driver configured to synchronize a first data signal of the plurality of data signals with the first boosted clock signal, and output the first data signal to an output pad; and a second output driver configured to synchronize a second data signal of the plurality of data signals with the second boosted clock signal, and output the second data signal to the output pad.

10. A data output circuit for a memory device, configured to multiplex a plurality of data signals read from a memory cell array, the data output circuit comprising:

a first clock boosting buffer configured to receive a first internal clock signal generated based on a first power voltage greater than a ground voltage, and to generate a first boosted clock signal based on a second power voltage having a voltage level greater than that of the first power voltage;

a second clock boosting buffer configured to receive a second internal clock signal generated based on the first power voltage, and to generate a second boosted clock signal based on the second power voltage;

a first output driver configured to synchronize a first data signal of the plurality of data signals with the first boosted clock signal, and output the first data signal to an output pad; and a second output driver configured to synchronize a second data signal of the plurality of data signals with the second boosted clock signal, and output the second data signal to the output pad.

11. The data output circuit of claim 10, wherein the first output driver includes a first inverter configured to invert the first data signal, the first inverter connected to the first power voltage, and wherein the second output driver includes a second inverter configured to invert the second data signal, the second inverter connected to the first power voltage.

12. The data output circuit of claim 10, wherein the first output driver includes a first n-channel metal oxide semiconductor (NMOS) transistor configured to operate in synchronization with the first boosted clock signal and to transmit the first data signal to the output pad, and wherein the second output driver includes a second NMOS transistor configured to operate in synchronization with the second boosted clock signal and to transmit the second data signal to the output pad.

13. The data output circuit of claim 12, wherein the first clock boosting buffer and the second clock boosting buffer are configured to respectively generate the first boosted clock signal and the second boosted clock signal based on the second power voltage having various voltage levels according to a resistance value of at least one equivalent resistance selected from the group consisting of the first NMOS transistor and the second NMOS transistor.

14. The data output circuit of claim 13, wherein when the first NMOS transistor has a first resistance value, a voltage level of the second power voltage is a first voltage, and wherein when the first NMOS transistor has a second resistance value greater than the first resistance value, a voltage level of the second power voltage is a second voltage having a voltage level less than that of the first voltage.

15. A memory device comprising:

a memory cell array including a plurality of memory cells;

an internal clock buffer configured to receive an external clock signal and to output a first internal clock signal having a logic high level of a first power voltage greater than a ground voltage;

a first clock buffer configured to receive the first internal clock signal and to output a first output clock signal having a logic high level of a second power voltage greater than the first power voltage;

a first output driver configured to receive a first data input signal from the memory cell, and to output a first data output signal having a logic high level of the first power voltage; and a first switching transistor configured to transfer the first data output signal to a first output pad in response to the first output clock signal.

16. The memory device of claim 15, further comprising:

at least a second clock buffer configured to receive at least a second internal clock signal having a logic high level of the first power voltage, and to generate at least a second output clock signal having a logic high level of the second power voltage, the second internal clock signal having a different phase from the first internal clock signal;

at least a second output driver configured to receive at least a second data input signal from the memory cell array, and to output at least a second data output signal having a logic high level of the first power voltage; and at least a second switching transistor configured to transfer the second data output signal to the first output pad in response to the second output clock signal.

17. The memory device of claim 15, further comprising:

a voltage generator connected to a third power voltage greater than the second power voltage, and configured to generate the second power voltage in response to a reference voltage, wherein the voltage generator is disposed separate from the first clock buffer.

18. The memory device of claim 17, wherein the voltage generator includes:

a comparison amplifier configured to compare the second power voltage to the reference voltage; and a transistor configured to receive the third power voltage, and to output the second power voltage based on a result of the comparison.

19. The memory device of claim 17, further comprising:

a voltage level detector configured to detect a voltage level of the first data output signal, wherein the voltage generator is configured to generate the second power voltage based on the detected voltage level.

* * * * *